United States Patent [19]

Cinzori et al.

[11] Patent Number: 4,799,309
[45] Date of Patent: Jan. 24, 1989

[54] METHOD OF MAKING A RECTIFIER AND CONTROL MODULE FOR AN ALTERNATOR

[75] Inventors: Carl Cinzori, Dearborn Heights; Carl Williams, Jr., Livonia; Clair E. Mitchell, Detroit; David L. Striker, Plymouth, all of Mich.

[73] Assignee: Ford Motor Company, Dearborn, Mich.

[21] Appl. No.: 137,774

[22] Filed: Dec. 24, 1987

[51] Int. Cl.⁴ .................................... H02K 15/00
[52] U.S. Cl. .................................... 29/596; 29/840; 437/209; 437/215; 310/68 D
[58] Field of Search .................. 29/596, 597, 840; 437/209, 215; 310/68 D; 357/76, 77

[56] References Cited

U.S. PATENT DOCUMENTS

| | | |
|---|---|---|
| 3,184,625 | 5/1960 | Farison . |
| 3,296,451 | 11/1963 | Van Ausdal et al. . |
| 3,496,447 | 12/1967 | Thompson . |
| 3,539,850 | 11/1970 | Sato . |
| 3,546,563 | 12/1970 | Thompson . |
| 3,568,041 | 3/1971 | Arakane . |
| 3,593,113 | 7/1971 | Wiley . |
| 3,889,285 | 6/1975 | Milewski et al. . |
| 3,925,809 | 12/1975 | Striker . |
| 3,959,676 | 5/1976 | Striker . |
| 4,031,268 | 6/1977 | Fairbairn . |
| 4,162,419 | 7/1979 | De Angelis . |
| 4,218,694 | 8/1980 | Grzybowski . |
| 4,285,781 | 8/1981 | Le Rouzic et al. . |
| 4,297,391 | 10/1981 | Lindmayer . |
| 4,382,222 | 5/1983 | Kurz et al. . |
| 4,412,377 | 11/1983 | Nagashima et al. . |
| 4,538,169 | 8/1985 | Smith et al. . |
| 4,542,401 | 9/1985 | Sekiba . |

FOREIGN PATENT DOCUMENTS 0213981 7/1986 European Pat. Off. .

Primary Examiner—Carl E. Hall
Attorney, Agent, or Firm—Paul K. Godwin, Jr.; Clifford L. Sadler

[57] ABSTRACT

A rectifier circuit and control regulator are assembled onto a single plate for integral installation within the housing of an alternator. The method includes fabricating the plate with insulating, masking and conducting layers so as to provide mounting areas for commonly oriented rectifier diodes and efficient cooling for the entire unit.

10 Claims, 4 Drawing Sheets

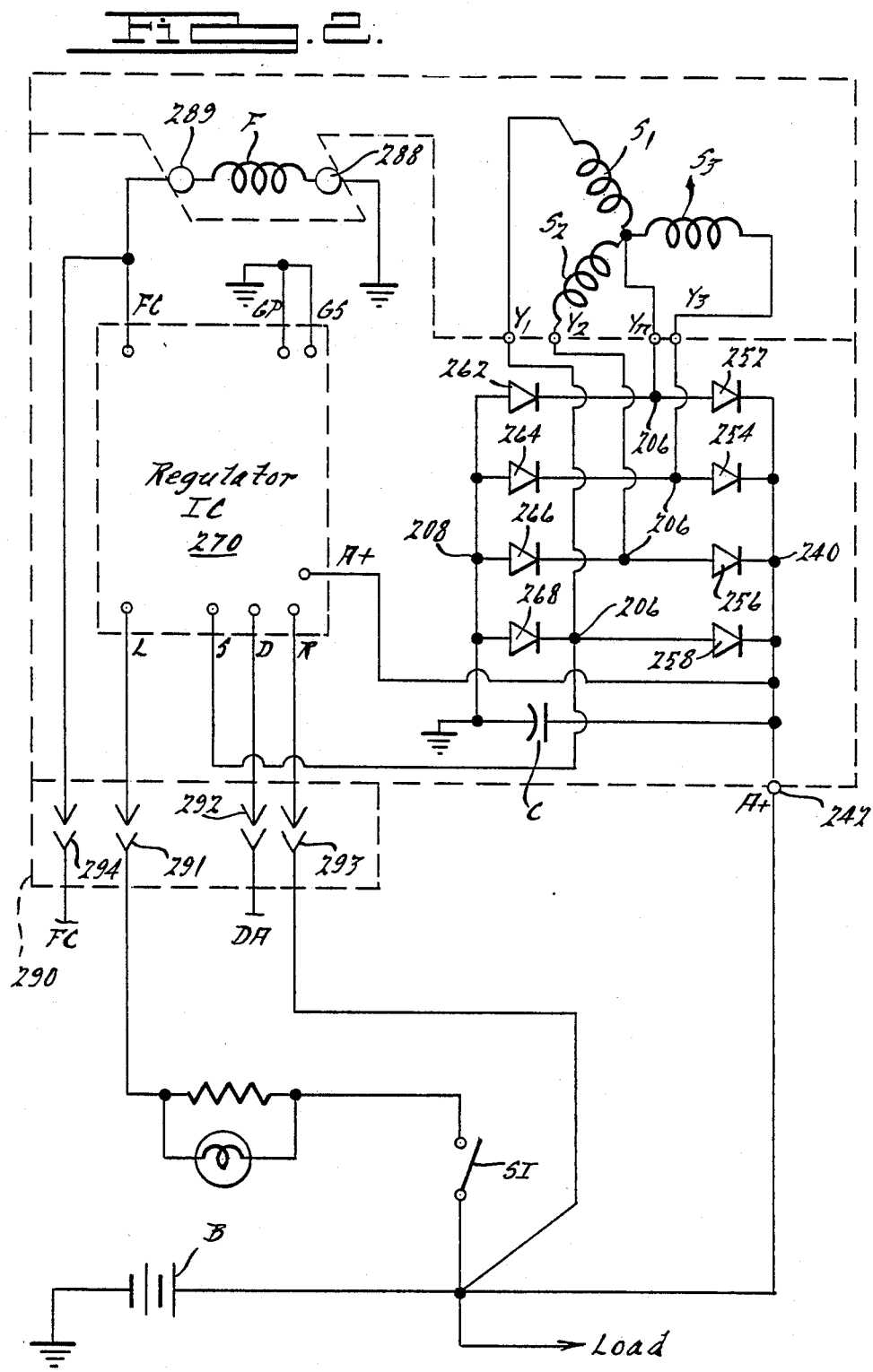

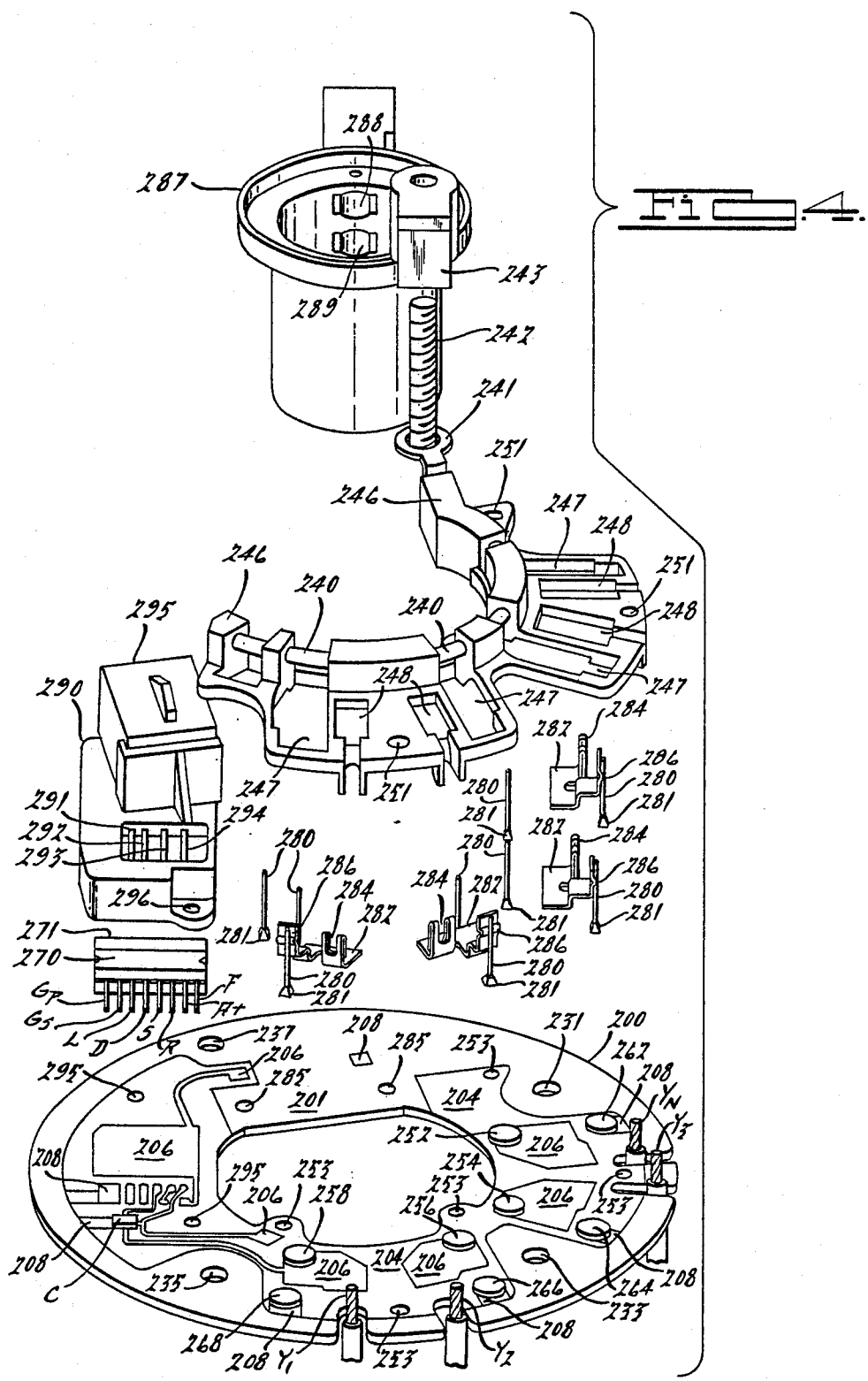

METHOD OF MAKING A RECTIFIER AND CONTROL MODULE FOR AN ALTERNATOR

BACKGROUND OF THE INVENTION

1. Field of the Invention

The present invention is directed to the field of alternators as employed to supply D.C. electrical power to automotive vehicles and more specifically to the area of alternator construction in which both the rectifier assembly and the regulator circuitry are provided within the alternator housing.

2. Description of the Prior Art

Much work has been done in the past to increase the heat dissipation efficiencies of rectifier diode assemblies mounted within alternator housings. As part of that work, numerous disclosures have been made for both diode construction and mounting techniques.

U.S. Pat. No. 3,184,625 describes a technique for mounting rectifier diodes on metal plates within the housing of an alternator. The metal plates are shown to provide electrical interconnection to common terminals for each set of diodes. However, numerous wire-to-terminal solder connections are required to interconnect the diodes in the rectifier network.

U.S. Pat. Nos. 3,539,850, 3,925,809, 3,959,676, 4,218,694 and 4,538,169 all show various techniques for sandwiching diode elements between interconnecting conductors to provide the rectifier network in a manner that will facilitate heat dissipation.

SUMMARY OF THE INVENTION

The present invention steps beyond the techniques disclosed in the prior art by providing an efficient method of fabricating an alternator control module. The entire rectifier network is fabricated on a single metal heat sink plate and combined with a brush holder, a regulator circuit and an electrical connector for installation inside the alternator. The fabrication is performed in such a manner that the resultant control module becomes a unitary structure; and when assembled with the other components of the alternator offer significant cost reductions in that assembly process.

The method of fabricating the rectifier circuit described herein includes the steps of:

(a) Providing an electrically and heat conducting plate member.

(b) Coating a first predetermined pattern area on the plate member with an electrically insulating layer that leaves a second predetermined pattern area exposed.

(c) Masking a predetermined portion of the first predetermined pattern area to expose the remainder of the insulating layer.

(d) Depositing an electrically conducting film on both the exposed surfaces of the plate member and the insulating layer in a third predetermined pattern to form conductor runs that are respectively and separately bonded to the conducting plate or the insulating layer.

(e) Providing a first predetermined number of like rectifier diode elements each having respective anode and cathode terminals disposed on opposite sides thereof.

(f) Bonding the anode terminals of a portion of the predetermined number of the rectifier diode elements directly to preselected ones of the conductor runs that are bonded to the conducting plate.

(g) Bonding the anodes of the remainder of the rectifier diode elements directly to preselected ones of the conductor runs that are bonded to the insulating layer.

(h) Providing a second predetermined number of electrically conducting elements configured to extend from the cathode terminals, of rectifier diode elements bonded to the conducting plate, to the preselected ones of the conductor runs bonded to the insulating layer.

(i) Electrically bonding an electrically conducting element to both the cathode terminal of each of the rectifier diode elements bonded to the conducting plate and to a preselected conductor run onto which the anode terminal of a corresponding rectifier diode element is bonded.

(j) Providing a common bus bar conductor formed to be connected to the DC output terminal of the alternator, having exposed portions and being mounted within an insulated means.

(k) Mounting the common bus bar conductor insulating means on the plate so that exposed portions of the bus bar conductor are adjacent the cathode terminals of the rectifier diode elements bonded to the conductor runs bonded to the insulating layer.

(l) Electrically bonding the bus bar conductor to the adjacent cathode terminal of the diode elements.

Each of the placement and connecting steps are ideally suited to be performed by automated machine or robotic apparatus, since the diode elements need not be sorted or otherwise segregated by types or orientation. Each diode element is of the same orientation as any other and has its respective anode terminal bonded to the appropriate position containing the electrically conducting film.

Along with the foregoing steps which result in the formation of the rectifier network, a regulator circuit, preferably a multi-leaded integrated circuit, is provided and is also bonded onto a conducting film area deposited on the insulating layer. Leads from the regulator circuit are appropriately bonded to corresponding conductor runs so that it will become integral with the alternator. Integrating the regulator circuit into the alternator eliminates the need for a wire harness which would conventionally interconnect the field and stator windings of the alternator and an externally located regulator circuit.

Following the connection of the regulator circuit to the plate member and to the appropriate conductor runs, an electrical connector is permanently connected to the plate member and the connector terminals are electrically bonded to appropriate conductor runs.

A brush holder is also provided that contains a plurality of brushes for making contact with the alternator rotor slip rings. The brush holder is permanently connected to be aligned with the central aperture of the plate member and the two brushes are respectively electrically connected to an appropriate conductor run and to ground, to provide field current connection when the alternator is assembled.

It is therefore an object of the present invention to provide a unique method of assembling a diode element rectifier assembly or use in alternator applications.

It is another object of the present invention to provide an integrated alternator control that is efficiently packaged for assembly into an alternator housing.

It is still another object of the present invention to provide a diode element rectifier assembly that is both efficiently constructed and allows for a high degree of heat dissipation.

BRIEF DESCRIPTION OF THE DRAWINGS

FIG. 2 is an electrical schematic diagram of an alternator and the control module as employed in the preferred embodiment of the invention described herein.

FIG. 4 is an exploded perspective view of the various components being assembled onto the plate member of the present invention.

DETAILED DESCRIPTION OF THE PREFERRED EMBODIMENT

Figure 1:
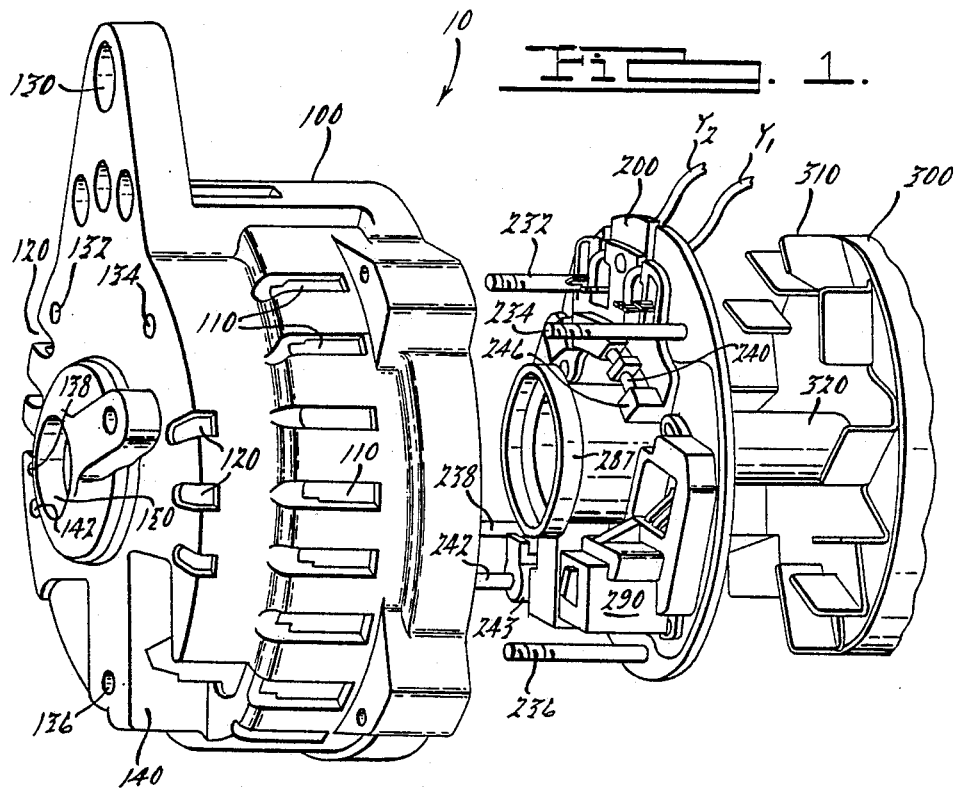
FIG. 1 is an exploded perspective view of the control module of the present invention along with other components of an alternator in the preferred embodiment.

A preferred embodiment of the invention is illustrated in FIG. 1 as a control module 10 for assembly into an alternator housing 100 along with a field winding rotor 300.

In the exploded view of FIG. 1, the housing 100 contains several vent apertures, designated 110 and 120, that are distributed around the periphery and at the closed end to provide internal access for cooling air. The housing 100 also contains an extension 130 which allows for attachment of the alternator to a mounting bracket (not shown). Central to the housing 100, is a bearing retainer 150 into which the shaft 320 of the field winding 300 rotor is mounted. Apertures 132, 134, 136 and 138 are located at the end of the housing 100 to provide mounting support for the control module 10. An aperture 142 is also located at the end of the housing 100 to provide clearance for the electrical output terminal 242 that is mounted on the control module 10. A large cutout 140 is also located at the end of the housing 100 so as to provide clearance and access to an electrical connector 290 that is mounted on the control module 10.

In the control module 10, several key elements are illustrated and are described in detail below. Those elements, for assembly purposes, are an apertured base plate 200, support rods 232, 234, 236 and 238, electrical connector 290, output terminal 242, brush holder 287 and bus bar 240. The control module 10 is centered so that the field winding rotor 300, containing an internal fan 310 and a slip ring shaft 320, is concentric with the brush holder 287 and the bearing support 150. When fully assembled into the housing 100, the control module 10 is stationary with respect to the housing 100 while the field winding rotor 300 and fan 310 are free to rotate about the concentric axis on the shaft 320. In that manner the slip rings (not shown) of the slip ring shaft 320 will contact the spring loaded brushes in the brush holder 287. The cooling fan 310 is supported spaced apart from the base plate 200 and provides convection cooling to the plate and all the components mounted thereon.

Several process steps are employed in fabricating the control module 10. With reference to FIGS. 3A, 3B, 3C and 3D, several of the method steps are illustrated.

Figure 3A:
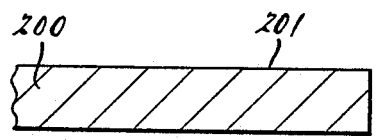
FIGS. 3A-3D illustrate steps employed to fabricate the plate member as used in the present invention.
Figure 3B:
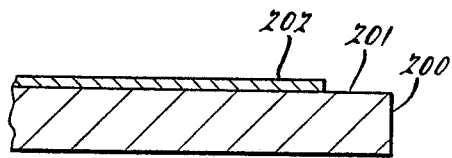
Figure 3C:
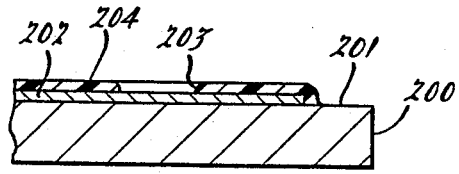
Figure 3D:
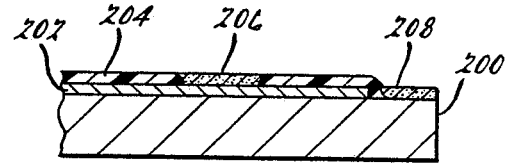

In FIG. 3A, the base plate 200 is illustrated and is preferably a metal stamping which has the properties of being highly conductive of both thermal and electrical energy. In the present invention, an aluminum alloy was selected. The base plate 200 has a top surface 201 onto which several layers of insulating and conducting materials are deposited. In FIG. 3B, a first coating 202 is made onto the surface 201 of the conducting base plate 200 in a predetermined pattern. The first coating 202 is of an electrically insulating layer, leaving selected areas 201 exposed. In the preferred embodiment, the insulating layer 202 is aluminum oxide, selected because of its favorable electrical insulating and thermal conducting properties. Subsequently, an inert mask layer 204 is shown in FIG. 3C as having been deposited to overlay the insulating layer 202 so as to mask a large portion of the insulating layer 202 and to expose other predetermined portions 203 of the insulating layer 202 and portions of the surface 201 of the underlying base plate 200. With the mask layer 204 in place, an electrically conducting film is deposited on the separately exposed surfaces of the insulating layer 202 (designated as isolated conducting films 206); and deposited on portions of the upper surface 201 of the base plate 200 (designated as conducting areas 208). In the preferred embodiment, the step of depositing conducting film on the exposed surfaces of the plate member and the insulating layer is performed by using a flame or plasma spraying process which deposits copper. With such a process step, subsequent bonding of electrical components is made easier using conventional soldering techniques.

Figure 5:
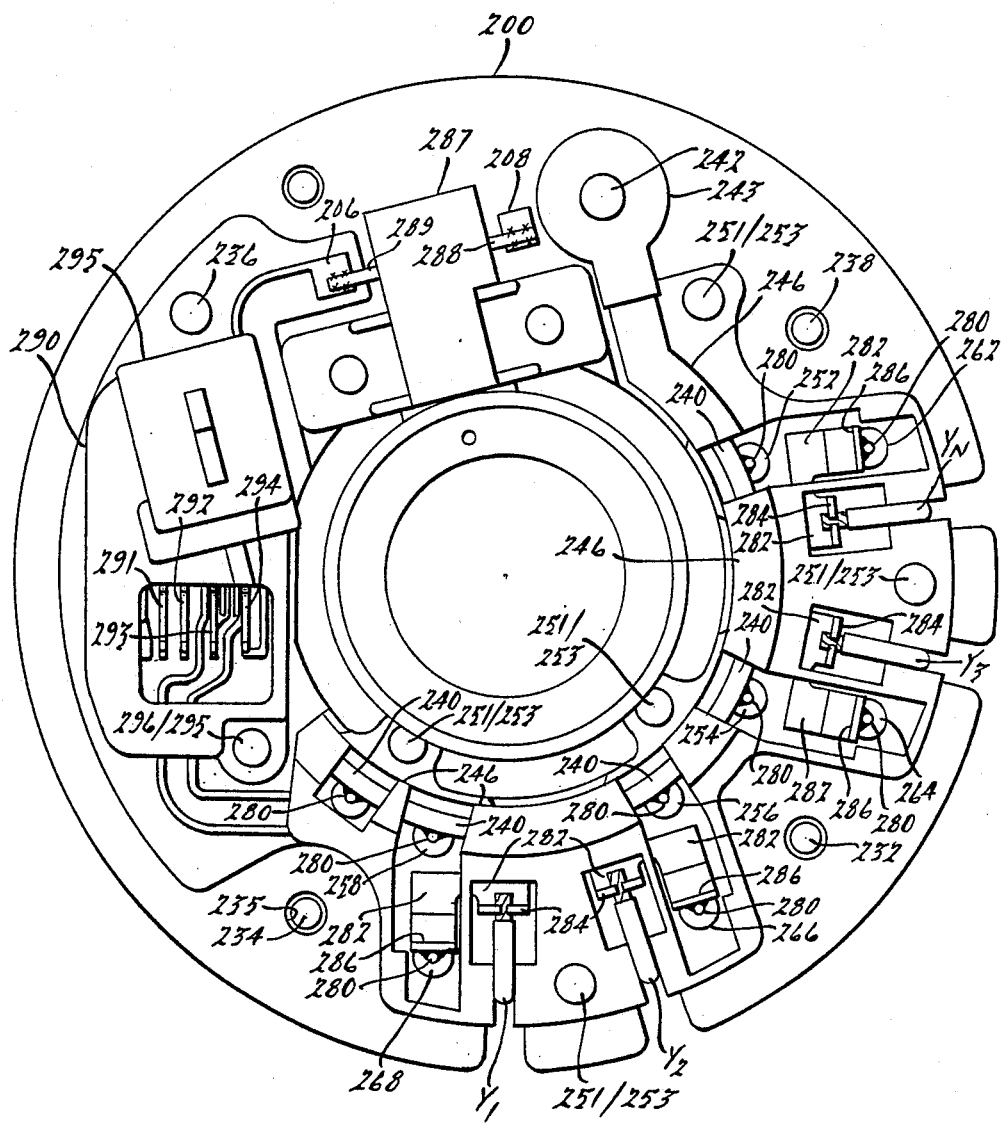
FIG. 5 is a plan view of the assembled embodiment of the control module invention.

In FIGS. 4 and 5, the various patterns of the conducting areas 206 and 208 are illustrated as deposited on the base plate 200. Corresponding numerical designations are employed in the schematic of FIG. 2 wherever relevant to facilitate a better understanding of the component relationships as placed on the base plate 200. In the exploded view of FIG. 4, rectifier diode disks 252, 254, 256 and 258 are shown as deposited on isolated conductive pads 206. Rectifier diode die 262, 264, 266 and 268 are shown as bonded to conductive areas 208. In each case, the diode rectifier die are placed so that their respective anodes are being bonded to the substrate while their cathodes are exposed for subsequent connection. By the use of the fabrication techniques described herein, the diode die are all commonly oriented so that automatic placement of such diodes on the appropriate conductive areas eliminates any sorting or concern over orientation sequencing during installation. In this case, the diodes can be supplied to the automatic placement tool in a manner in which all of the diodes are commonly oriented.

Subsequent to deploying the diode rectifier die onto the appropriate positions on the plate 200, interconnect tabs 282 are deposited on the isolated conducting areas 206 adjacent diode rectifier die 252, 254, 256 and 258. Each of those interconnect tabs 282 are soldered to the isolated pads 206 along with the adjacent diode rectifier die. The interconnect tabs 282 contain upright U-shaped portions 284 for receiving a stator wire (YN, Y3, Y2 or Y1) and adjacent upright portions 286 that will be interconnected with the cathodes of respectively corresponding diode rectifiers (262, 264, 266 or 268). Terminal pins 280, containing expanded pads 281, are each electrically bonded to the exposed cathodes of the diode rectifier die and, in the case of rectifier diodes 262, 264, 266 and 268, the upright pins 280 are also electrically bonded to the upright portion 286 on each associated interconnect tab 282.

A bus bar 240, shown embedded in a molded insulator 246, is structured to have exposed areas which correspond to the location of terminal pins 280 extending from the cathodes of rectifier diodes 252, 254, 256 and 258. Each of those pins 280 are also bonded to the bus bar 240.

The bus bar 240 serves as the A+ output having a terminal 242 which, upon assembly, extends out of the alternator housing 100. An insulator 243 is illustrated as a cylinder which when assembled, provides electrical insulation between the terminal 242 and the housing 100.

The various sized apertures 247 and 248 formed in the bus bar support 246 serve to provide for adequate clearance for the pins 280 and the tabs 282 during assembly. Those apertures are subsequently filled with a potting material after assembly is completed to protect the electrical connections from corrosion and provide mechanical support for U-shaped portion 284 of interconnecting tabs 282. Apertures 251 in the bus bar insulator 246 are spaced to correspond to apertures 253 in the base plate 200 so that appropriate fasteners (rivets) can be used to attach the insulator to the plate 200.

A brush holder 287 is also shown having a pair of spring biased brushes 288 and 289. This brush holder 287 contains a pair of electrical leads, also designated 288 and 289 (see FIG. 5), which extend from the brushes and are respectively electrically bonded to conducting areas 208 and 206 shown t be adjacent apertures 285 and the base plate 200. The apertures 285 are located to accept the fasteners that attach the brush holder 287 to the base plate 200. Apertures 231, 233, 235 and 237 respectively serve to support subsequently inserted mounting rods 232, 234, 236 and 238. These mounting rods also provide a thermal cooling path to the housing 100 when assembled.

A regulator circuit IC 270 is also mounted on the base plate 200 at the enlarged conductive area 206 between the apertures 295. The 8 pins and heat sink 271 which extend from the regulator circuit IC 270 are designated F, A+, R, S, D, L, $G_S$ and $G_P$. The F terminal provides for control of the field current and is internally interconnected to the heat sink 271 and connected through connector terminal 294 to a field control (FC) for external control, if desired. The A+ terminal is the sensing terminal for monitoring the alternator voltage output at the alternator. The R terminal is connected through connector terminal 293 for monitoring the battery "B" voltage level. The S terminal is connected to a stator winding $S_1$ through stator winding lead wire $Y_1$. The D terminal is for external control through connector terminal 292 for controllably disabling the regulator circuit. The L terminal is for providing energization of the regulator and the warning lamp L-1 through connector terminal 291 for normal operation and when there is a failure in the regulator or alternator output. The $G_P$ and $G_S$ terminals are power ground and signal ground, respectively.

Subsequent to bonding the regulator integrated circuit 270 to the appropriate pads formed on the base plate 200, an electrical connector socket is permanently attached to the base plate 200 so that its fastening apertures 296 are superimposed and aligned with apertures 295 for the acceptance of an appropriate attachment fastener. Connector terminals 291, 292, 293 and 294 as viewed through an aperture in the base 290 of the connector 295, are positioned so that when that connector is permanently attached to the base plate 200, the terminals 291-294 correspond to and may be electrically bonded to the pads adjacent to those of the regulator circuit IC 270 (see FIG. 5).

In referring to FIG. 5, the interconnection of the aforementioned elements is shown as an assembled unit in which the regulator, the brush holder and the diode regulator form an integral unit suitable for installation within the alternator. The stator winding lead Y1 is shown as connected to the tab 282 at the junction between the anode of diode rectifier disk 258 and the cathode of diode rectifier disk 268. Connections of stator winding leads Y2, Y3 and YN are also shown in accordance with the schematic shown in FIG. 2.

By employing the above described method of assembling a rectifier circuit on a conductive plate, the diode anodes are each in an intimate thermal conducting relationship with the base plate. Therefore, the resulting structure has been found to have highly efficient heat dissipation characteristics, as compared to rectifier assemblies of other commercially available alternators.

It will be apparent that many modifications and variations may be implemented without departing from the scope of the novel concept of this invention. Therefore, it is intended by the appended claims to cover all such modifications and variations which fall within the true spirit and scope of the invention.

We claim:

1. A method of assembling a rectifier circuit onto a conducting plate member for installation within the housing of a vehicle type alternator having a fixed set of stator windings and a rotor mounted field winding, including the steps of:

providing an electrically and heat conducting plate member;

coating a first predetermined pattern are of said plate member with an electrically insulating layer that leaves a second predetermined pattern area exposed;

masking a predetermined portion of said first predetermined pattern area to expose the remainder of said insulating layer;

depositing an electrically conducting film on the exposed surfaces of said plate member and said insulating layer in a third predetermined pattern to form conductor runs that are respectively and separately bonded to said conducting plate or said insulating layer;

providing a first predetermined number of like rectifier diode elements each having distinctive anode and cathode terminals disposed on opposite sides thereof;

bonding the anode terminals of a portion of said predetermined number of said rectifier diode elements directly to preselected ones of said conductor runs that are bonded to said conducting plate;

bonding the anodes of the remainder of said rectifier diodes directly to preselected ones of said conductor runs that are bonded to said insulating layer;

providing a second predetermined number of electrically conducting elements configured to extend from the cathode terminals, of rectifier diodes bonded to said conducting plate, to the preselected ones of said conductor runs bonded to said insulating layer;

electrically bonding an electrically conducting element to both the cathode terminal of each of said rectifier diodes bonded to said conducting plate and to a preselected conductor run onto which the anode terminal of a corresponding rectifier diode is bonded;

providing a common bus bar conductor formed to be connected to the DC output terminal of said alternator, having exposed portions and being mounted within an insulated means;

mounting said common bus bar conductor insulating means on said plate so that exposed portions of said bus bar conductor are adjacent the cathode terminals of said rectifier diodes bonded to said conductor runs bonded to said insulating layer; and bonding said common bus bar conductor to said adjacent cathode terminals.

2. A method as in claim 1, wherein said step of masking includes the step of coating an inert film layer over said predetermined portions of said first predetermined pattern area of said insulating layer to mask predetermined portions of said first predetermined pattern area and expose the remainder.

3. A method as in claim 2, wherein an epoxy resin is employed as said inert film layer.

4. A method as in claim 3, wherein said plate member is aluminum and said step of coating said plate with said insulating layer includes the step of forming aluminum oxide on the surface of said plate.

5. A method as in claim 4, wherein said step of depositing said conducting film on said exposed surfaces of said plate member and said insulating layer includes the step of flame or plasma spraying copper thereon.

6. A method as in claim 5, wherein an integrated voltage regulator circuit is provided which has a plurality of electrical terminals and said terminals are electrically bonded to selected ones of said conductor runs.

7. A method as in claim 6, wherein said plate is provided with a circular shape and a central aperture for surrounding the slip rings end of the rotor within said alternator.

8. A method as in claim 7, which further includes the steps of providing a set of brushes, within a brush holder configured to surround said slip rings, attaching said brush holder to said plate and electrically bonding said brushes to appropriate conductor runs.

9. A method as in claim 8, which further includes the steps of providing an electrical connector, within an insulated housing that is configured to overlay and surround said integrated voltage regulator circuit, that contains a plurality of electrical contact terminals extending beneath it, connecting said insulating housing to said plate at a location to overlay said integrated voltage regulator circuit and bonding said electrical contact terminals to appropriate conductor runs.

10. A method as in claim 9, which further includes the steps of attaching the stator windings of said alternator to said preselected ones of said conductor runs on said insulating layer onto which the cathode terminals of rectifier diodes are bonded.

* * * * *